United States Patent
Eguchi et al.

(10) Patent No.: US 11,581,307 B2
(45) Date of Patent: Feb. 14, 2023

(54) SEMICONDUCTOR DEVICE

(71) Applicant: Mitsubishi Electric Corporation, Tokyo (JP)

(72) Inventors: Keisuke Eguchi, Tokyo (JP); Rei Yoneyama, Tokyo (JP); Nobuchika Aoki, Tokyo (JP); Hiroki Hidaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/791,490

(22) Filed: Feb. 14, 2020

(65) Prior Publication Data

US 2020/0343240 A1 Oct. 29, 2020

(30) Foreign Application Priority Data

Apr. 26, 2019 (JP) .............................. JP2019-084826

(51) Int. Cl.
*H01L 29/78* (2006.01)
*H01L 27/07* (2006.01)
*H01L 23/00* (2006.01)

(52) U.S. Cl.
CPC .......... *H01L 27/0727* (2013.01); *H01L 24/45* (2013.01); *H01L 29/7805* (2013.01)

(58) Field of Classification Search
CPC ............. H01L 29/7804; H01L 29/7805; H01L 29/7806; H01L 29/7808; H01L 29/7395; H01L 29/0696
See application file for complete search history.

(56) References Cited

U.S. PATENT DOCUMENTS

| | | | |
|---|---|---|---|
| 2008/0048295 A1* | 2/2008 | Takahashi | H01L 29/4236 257/565 |
| 2010/0156506 A1* | 6/2010 | Tsuzuki | H03K 17/0828 327/478 |
| 2010/0308370 A1* | 12/2010 | Hshieh | H01L 29/7397 257/136 |
| 2013/0248882 A1* | 9/2013 | Ogura | H01L 29/66348 257/77 |
| 2019/0081162 A1* | 3/2019 | Gejo | H01L 29/4236 |
| 2019/0287964 A1* | 9/2019 | Yamano | H01L 24/45 |

FOREIGN PATENT DOCUMENTS

JP 2013-138069 A 7/2013
WO 2018225571 A1 12/2018

* cited by examiner

*Primary Examiner* — Jesse Y Miyoshi
(74) *Attorney, Agent, or Firm* — Studebaker & Brackett PC

(57) ABSTRACT

The object is to provide a semiconductor device that prevents a snapback operation and has excellent heat dissipation. The semiconductor device includes a semiconductor substrate, transistor portions, diode portions, a surface electrode, and external wiring. The transistor portions and the diode portions are provided in the semiconductor substrate and are arranged in one direction parallel with the surface of the semiconductor substrate. A bonding portion of the external wiring is connected to the surface electrode. The transistor portions and the diode portions are provided in a first region and a second region and alternately arranged in the one direction. A first transistor width and a first diode width in the first region are smaller than a width of the bonding portion. A second transistor width and a second diode width in the second region are larger than the width of the bonding portion.

15 Claims, 7 Drawing Sheets

SEMICONDUCTOR DEVICE

BACKGROUND OF THE INVENTION

Field of the Invention

The present invention relates to a semiconductor device.

Description of the Background Art

Conventionally, in the field of semiconductor devices, characteristics of semiconductor elements have been improved such as thinning of the semiconductor elements in order to prevent a temperature rise that occurs when the semiconductor elements operate. In the midst of the ongoing downsizing of semiconductor devices, the reduction has been made in an area of semiconductor elements inevitably. However, as the improvement in characteristics of semiconductor elements approaches the limit, the thermal design of semiconductor modules has become harsher.

In recent years, a semiconductor device including a transistor portion including an Insulated Gate Bipolar Transistor (IGBT) and a diode portion is known as a semiconductor device of which heat dissipation is improved (see WO2018/225571).

The semiconductor device disclosed in WO2018/225571 has a planar shape in which transistor portions and diode portions are alternately arranged when observed from the front surface direction of the substrate. In addition, the semiconductor device has the external wiring bonded to the surface electrode, and the contact width between the external wiring and the surface electrode is larger than one side of the width of the transistor portion and the width of the diode portion. With such a structure, in the semiconductor device disclosed in WO2018/225571, although, thermal fatigue at the bonding portion of the external wiring is alleviated, on the other hand, there is a concern that a snapback operation is likely to occur and the on-voltage is deteriorated.

Japanese Patent Application Laid-Open No. 2013-138069 discloses a technique for preventing a snapback operation. The semiconductor device disclosed in Japanese Patent Application Laid-Open No. 2013-138069 has a configuration in which a plurality of strip-shaped IGBT cell regions and a plurality of diode cell regions are alternately arranged adjacent to each other. The plurality of IGBT cell regions are composed of a narrow strip width region having a narrow strip shape and at least one wide strip width region wider than the narrow strip width region. The semiconductor device disclosed in Japanese Patent Application Laid-Open No. 2013-138069 prevents the snapback operation at the start of energization of the IGBT cell region by the wide strip width region. However, in Japanese Patent Application Laid-Open No. 2013-138069, the snapback operation at the start of energization in the diode cell regions is not taken into consideration, and there is a concern that the on-voltage of the diode may be deteriorated.

In order to prevent the snapback operation at the start of energization of the transistor portion, the width of the p+ layer on the back surface of the transistor portion needs to be larger than a predetermined value determined by the resistivity and thickness of the n-drift layer. In order to prevent the snapback operation at the start of energization of the diode portion, the width of the p+ layer on the surface of the diode portion needs to be larger than a predetermined value determined by the resistivity and thickness of the n-drift layer.

Accordingly, in order to prevent the snapback operation, a transistor portion and a diode portion having a width larger than a predetermined value are used. Meanwhile, from the viewpoint of improving heat dissipation, a transistor portion and a diode portion having excellent heat dispersion characteristic and a small width are used. Therefore, it has been difficult to realize a semiconductor device that prevents the snapback operation and has excellent heat dissipation.

SUMMARY

The object of the present invention is to provide a semiconductor device that prevents a snapback operation and has excellent heat dissipation.

The semiconductor device according to the present invention includes a semiconductor substrate, a plurality of transistor portions, a plurality of diode portions, a surface electrode, and external wiring. The plurality of transistor portions and the plurality of diode portions are provided in the semiconductor substrate and are arranged in one direction parallel with the surface of the semiconductor substrate. The surface electrode is provided on the surface of the semiconductor substrate, and is electrically connected to the plurality of transistor portions and the plurality of diode portions. The external wiring includes a bonding portion that is bonded to the surface electrode, and is electrically connected to the surface electrode at the bonding portion. The plurality of transistor portions and the plurality of diode portions are provided in a first region and a second region of the semiconductor substrate in plan view. Each of the plurality of transistor portions and each of the plurality of diode portions are alternately arranged in the one direction. A first transistor width which is the width in the one direction of each of the plurality of transistor portions in the first region and a first diode width which is the width in the one direction of each of the plurality of diode portions in the first region are smaller than a width of the bonding portion of the external wiring. A second transistor width which is the width in the one direction of each of the plurality of transistor portions in the second region and a second diode width which is the width in the one direction of each of the plurality of diode portions in the second region are larger than the width of the bonding portion of the external wiring.

According to the present invention, a semiconductor device that prevents a snapback operation and has excellent heat dissipation is provided.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
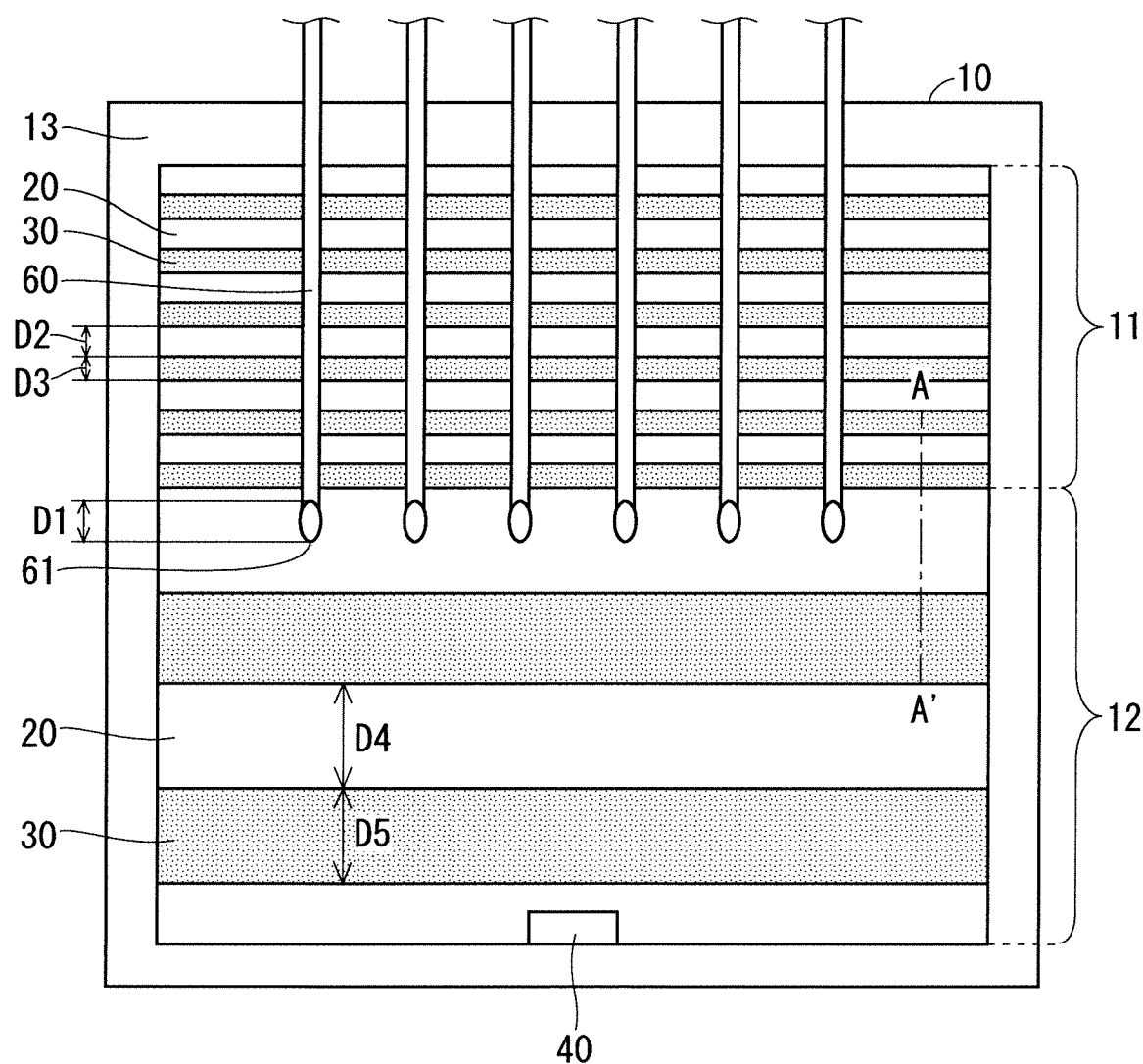
FIG. 1 is a plan view illustrating a configuration of a semiconductor device according to Embodiment 1.
Figure 2:
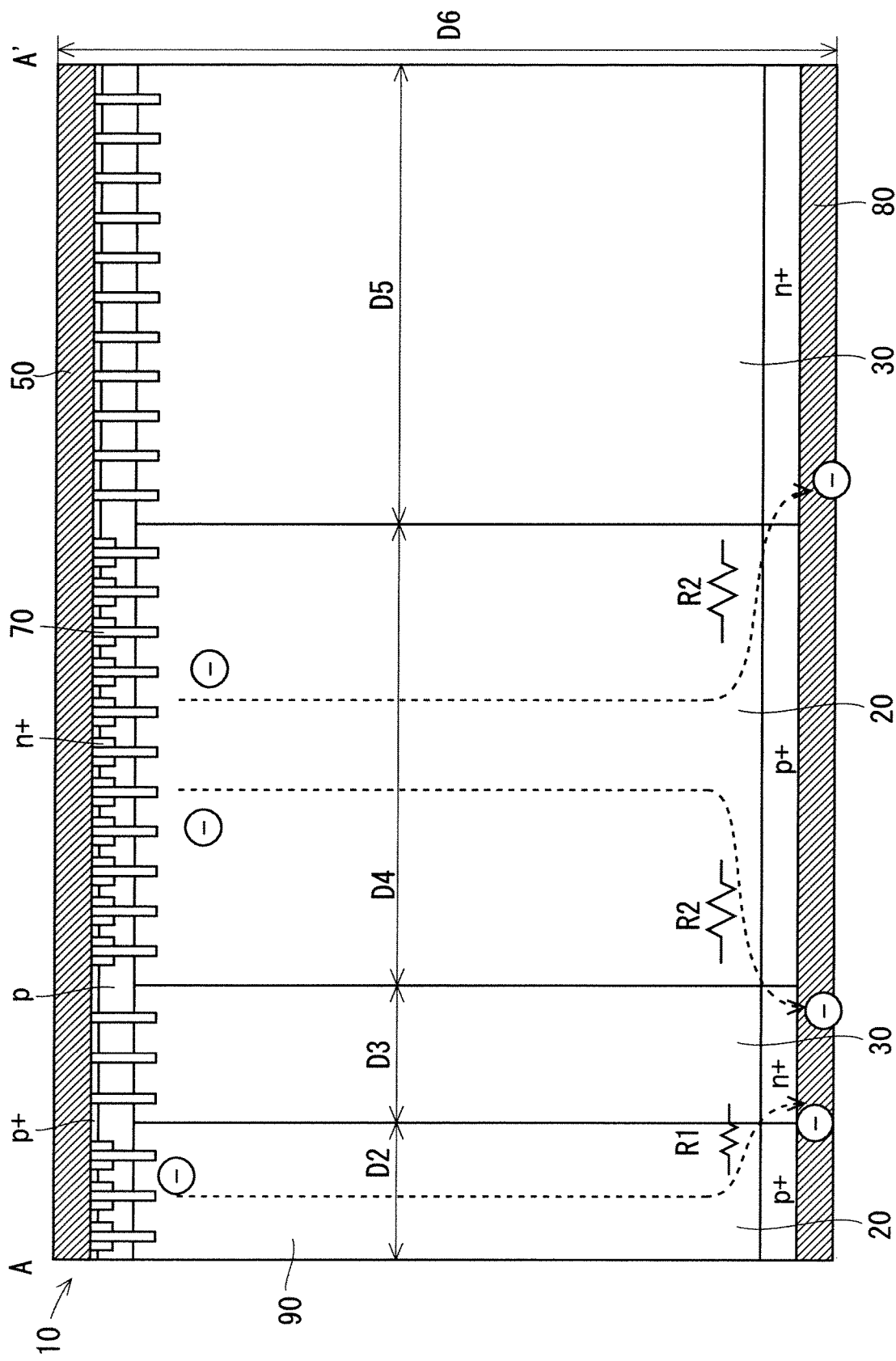
FIG. 2 is a cross-sectional view taken along the line A-A' illustrated in FIG. 1.

FIG. 1 is a plan view illustrating a configuration of a semiconductor device according to Embodiment 1. FIG. 2 is a cross-sectional view taken along the line A-A' illustrated in FIG. 1.

The semiconductor device includes a semiconductor substrate 10, a plurality of transistor portions 20, a plurality of diode portions 30, a gate electrode 40, a surface electrode 50 (not illustrated in FIG. 1), and external wiring 60.

The semiconductor substrate 10 has a first region 11, a second region 12, and a terminal region 13 in plan view. The terminal region 13 is provided along the outer periphery of the semiconductor substrate 10. The first region 11 and the second region 12 are located inside the terminal region 13, in other words, the terminal region 13 encloses the first region 11 and the second region 12. In Embodiment 1, the first region 11 and the second region 12 are adjacent to each other.

The plurality of transistor portions 20 and the plurality of diode portions 30 are arranged in both the first region 11 and the second region 12 as illustrated in FIG. 1 and are arranged in the vertical direction in the semiconductor substrate 10 as illustrated in FIG. 2. The plurality of transistor portions 20 and the plurality of diode portions 30 are arranged in alignment in one direction parallel with the surface of the semiconductor substrate 10. Hereinafter, the one direction is referred to as an arrangement direction. In addition, each of the plurality of transistor portions 20 and each of the plurality of diode portions 30 are alternately arranged in the arrangement direction. Further, the first region 11 and the second region 12 in Embodiment 1 are arranged adjacent to each other in the same direction as the arrangement direction.

The plurality of transistor portions 20 and the plurality of diode portions 30 each have a stripe structure. That is, the transistor portions 20 and the diode portions 30 have a rectangle shape that is long in a direction orthogonal to the arrangement direction in plan view. A first transistor width (D2) that is the width in the arrangement direction of a transistor portion 20 in the first region 11 is different from a second transistor width (D4) that is the width in the arrangement direction of a transistor portion 20 in the second region 12. Further, a first diode width (D3) which is the width in the arrangement direction of a diode portion 30 in the first region 11 is different from a second diode width (D5) which is the width in the arrangement direction of a diode portion 30 in the second region 12.

The gate electrode 40 is disposed on the surface of the semiconductor substrate 10 in the second region 12. Note that, in FIG. 1, the signal wiring connected to the gate electrode 40 is not illustrated.

As illustrated in FIG. 2, the surface electrode 50 is provided above the plurality of transistor portions 20 and the plurality of diode portions 30, that is, on the surface of the semiconductor substrate 10. The surface electrode 50 is electrically connected to the plurality of transistor portions 20 and the plurality of diode portions 30.

As illustrated in FIG. 1, External wiring 60 includes a bonding portion 61 that is bonded to the surface electrode 50. The external wiring 60 is electrically connected to the surface electrode 50 at the bonding portion 61.

The first transistor width (D2) and the first diode width (D3) are smaller than the width of the bonding portion 61 of the external wiring 60 (hereinafter referred to as bonding width (D1)). The second transistor width (D4) and the second diode width (D5) are larger than the bonding width (D1) of the bonding portion 61 of the external wiring 60.

As illustrated in FIG. 2, a plurality of trench gates 70 are provided on the surfaces of the transistor portions 20 and the diode portions 30. Further, a back electrode 80 is provided on the back surface of the semiconductor substrate 10. The semiconductor device according to Embodiment 1 is a so-called vertical semiconductor device that controls the current flowing between the surface electrode 50 and a back electrode 80. The transistor portions 20 include, for example, an Insulated Gate Bipolar Transistor (IGBT), a Metal Oxide Semiconductor Field Effect Transistor (MOSFET), or the like. The semiconductor substrate 10 includes, for example, a wide band gap semiconductor such as SiC or GaN as a material. The semiconductor device is, for example, a power semiconductor device such as a reverse conducting IGBT (RC-IGBT) in which the transistor portions 20 and the diode portions 30 are integrated on single semiconductor chip.

Next, the operation of the semiconductor device when energization of the transistor portions 20 is started will be described. At the start of energization in the transistor portions 20, electrons move in the direction of the dashed arrow illustrated in FIG. 2 until the voltage at the pn bonding portion reaches the built-in potential. The first transistor width (D2) is smaller than the bonding width (D1) of the external wiring 60; therefore, the parasitic resistance R1 of the n-drift layer 90 is small. Therefore, a snapback operation is likely to occur in the first region 11. However, the second transistor width (D4) is larger than the bonding width (D1) of the external wiring 60; therefore, the parasitic resistance R2 of the n-drift layer 90 is large. Therefore, the normal bipolar operation is realized in the second region 12. As described above, in the semiconductor device according to Embodiment 1, the second region 12 reduces the snapback operation at the start of energization of the transistor portions 20. The semiconductor device prevents deterioration of the on voltage.

Meanwhile, the first transistor width (D2) is narrower than the second transistor width (D4); therefore, the heat dissipation characteristics in the first region 11 are better than those in the second region 12. In the semiconductor device according to Embodiment 1, the first region 11 improves the heat dissipation of the semiconductor device.

Here, although the operation of the semiconductor device has been described by taking the start of energization of the transistor portions 20 as an example, the semiconductor device operates in the same manner as described above and exhibits the same effect when the energization of the diode portions 30 is started as well. That is, the snapback operation at the start of energization of the diode portions 30 is reduced, and the heat dissipation of the semiconductor device is improved.

In summary, the semiconductor device according to Embodiment 1 includes the semiconductor substrate 10, the plurality of transistor portions 20, the plurality of diode portions 30, the surface electrode 50, and the external wiring 60. The plurality of transistor portions 20 and the plurality of diode portions 30 are provided in the semiconductor substrate 10 and are arranged in one direction parallel with the surface of the semiconductor substrate 10. The surface electrode 50 is provided on the surface of the semiconductor substrate 10, and is electrically connected to the plurality of transistor portions 20 and the plurality of diode portions 30. The external wiring 60 includes the bonding portion 61 that is bonded to the surface electrode 50, and is electrically connected to the surface electrode 50 at the bonding portion 61. The plurality of transistor portions 20 and the plurality of diode portions 30 are provided in the first region 11 and the second region 12 of the semiconductor substrate 10 in plan view. Each of the plurality of transistor portions 20 and each of the plurality of diode portions 30 are alternately arranged in the one direction (the arrangement direction). The first transistor width which is the width in the one direction of each of the plurality of transistor portions 20 in the first region 11 and the first diode width which is the width in the one direction of each of the plurality of diode portions 30 in the first region 11 are smaller than the width of the bonding portion 61 of the external wiring 60. The second transistor width which is the width in the one direction of each of the plurality of transistor portions 20 in the second region 12 and the second diode width which is the width in the one direction of each of the plurality of diode portions 30 in the second region 12 are larger than the width of the bonding portion 61 of the external wiring 60.

Even when the snapback operation occurs in the first region 11 at the start of energization of the transistor portions 20 or the diode portions 30, such a semiconductor device can realize the normal bipolar operation in the second region 12. Therefore, the semiconductor device reduces the snapback operation, and as a result, prevents deterioration of the on-voltage. Further, the transistor portions 20 or the diode portions 30 in the first region 11 are densely arranged than those in the second region 12; therefore, the heat dissipation of the entire semiconductor device is improved.

Embodiment 2

A semiconductor device according to Embodiment 2 will be described. Note that the description of the same configuration and operation as in Embodiment 1 is omitted.

Figure 3:
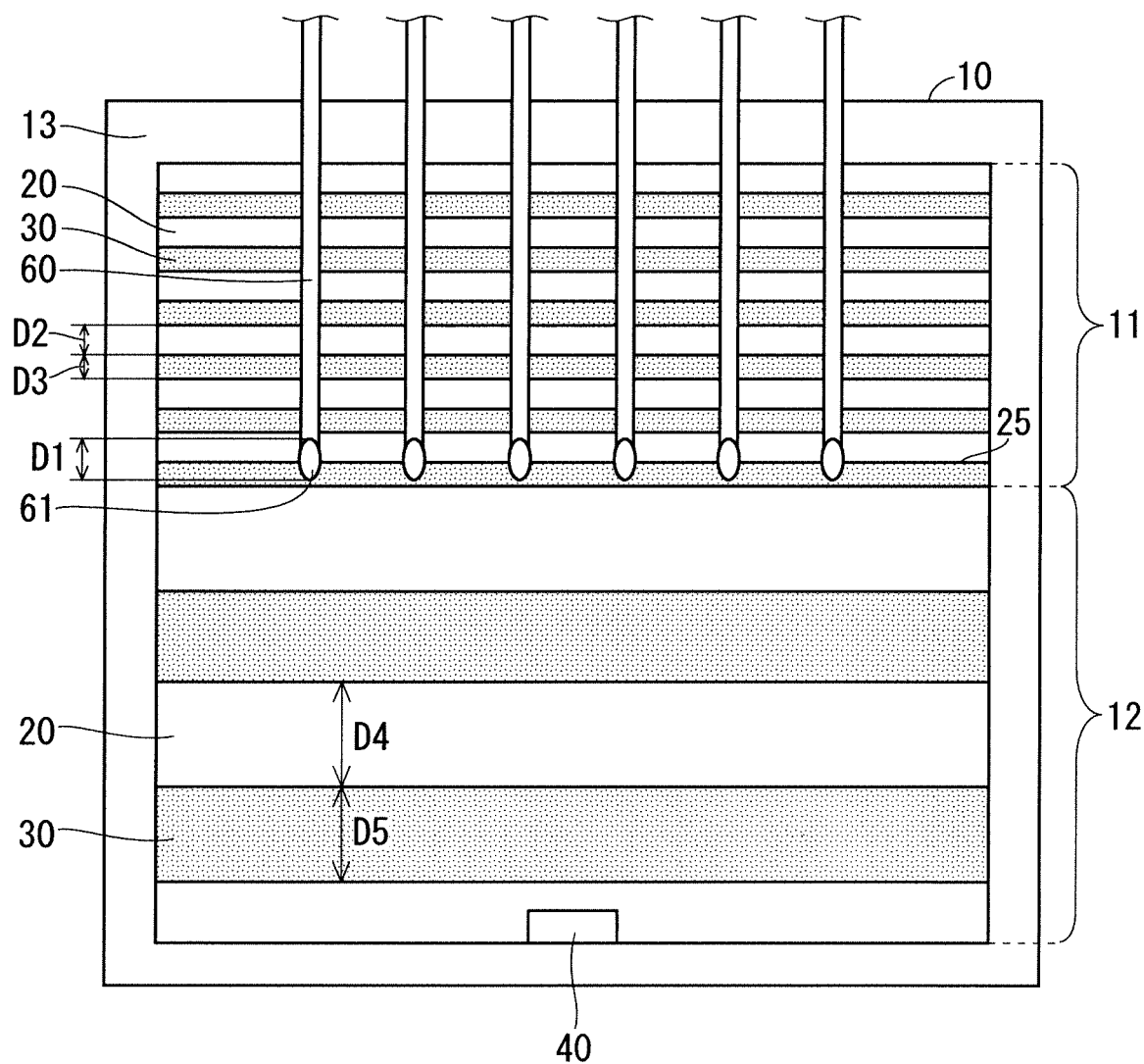
FIG. 3 is a plan view illustrating a configuration of a semiconductor device according to Embodiment 2.

FIG. 3 is a plan view illustrating a configuration of a semiconductor device according to Embodiment 2.

The bonding portion 61 of the external wiring 60 is bonded to the surface electrode 50 on the boundary 25 between a transistor portion 20 in the first region 11 and a diode portion 30 in the first region 11 adjacent to the transistor portion 20.

When the transistor portions 20 and the diode portions 30 are energized, the bonding portions 61 of the external wiring 60 become a heat source. However, in the semiconductor device according to Embodiment 2, the bonding portions 61 of the external wiring 60 are located on the first region 11 having excellent heat dissipation; therefore, the heat dissipation of the entire semiconductor device is improved. Furthermore, the bonding portions 61 of the external wiring 60 are disposed on the boundary 25; therefore, thermal fatigue at the bonding portions 61 of the external wiring 60 is alleviated. As a result, the long-term reliability of the semiconductor device is improved.

Embodiment 3

A semiconductor device according to Embodiment 3 will be described. Note that the description of the same configurations and operations as in Embodiment 1 or 2 is omitted.

Figure 4:
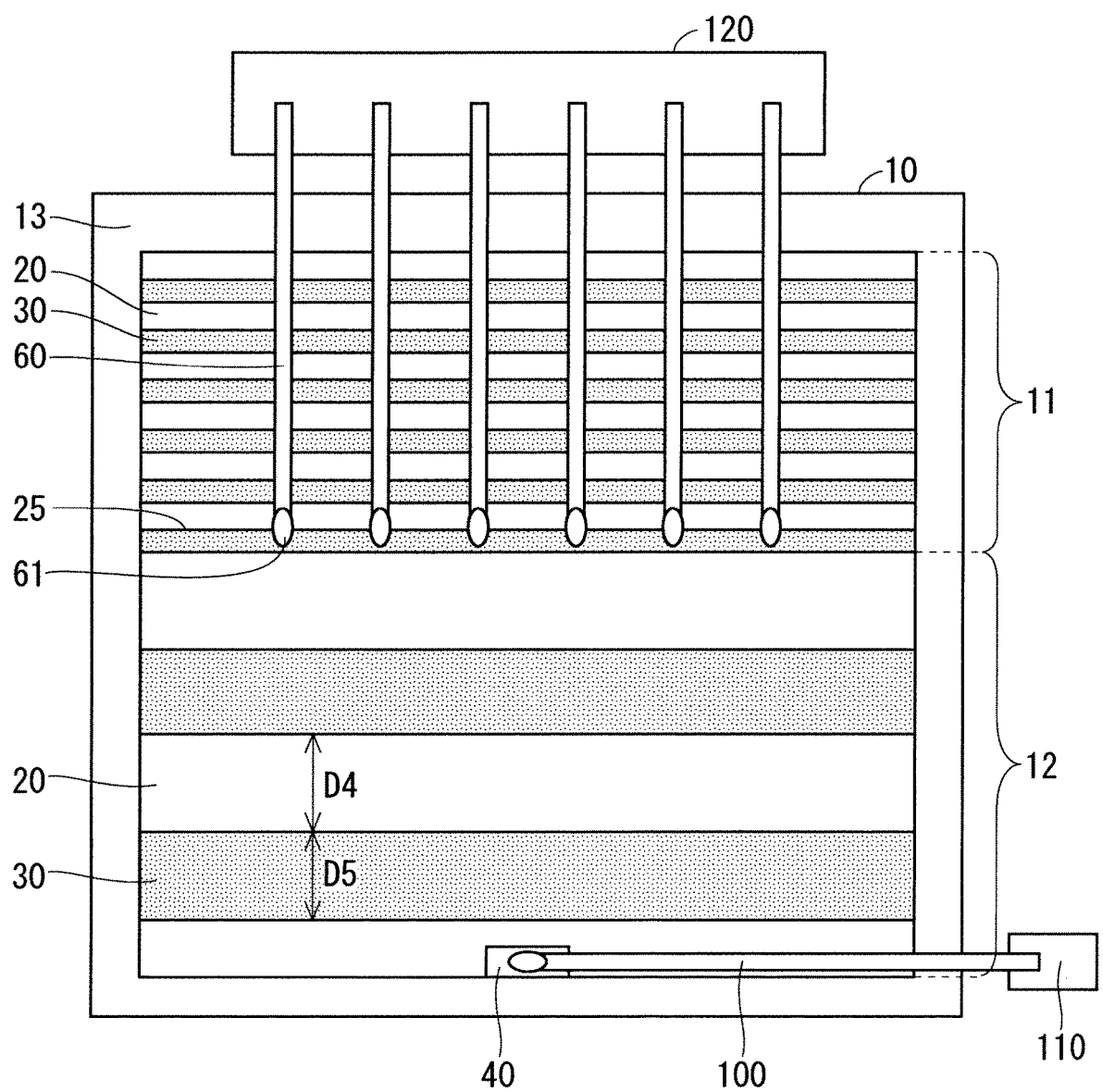
FIG. 4 is a plan view illustrating a configuration of a semiconductor device according to Embodiment 3.

FIG. 4 is a plan view illustrating a configuration of a semiconductor device according to Embodiment 3.

The first region 11 is provided in the direction opposite to signal wiring 100 connected to the gate electrode 40.

The signal wiring 100 electrically connects a signal wiring pattern 110 provided outside the semiconductor substrate 10 and the gate electrode 40 provided on the surface of the semiconductor substrate 10. Here, the signal wiring 100 extends in a direction orthogonal to the arrangement direction of the transistor portions 20 and the diode portions 30.

The bonding portion 61 of the external wiring 60 is bonded to the surface electrode 50 on the boundary 25 of the transistor portion 20 and the diode portion 30. The external wiring 60 electrically connects the surface electrode 50 and a main current wiring pattern 120 provided outside the semiconductor substrate 10. The external wiring 60 extends from the bonding portion 61 in a direction different from the direction in which the signal wiring 100 is located.

In the manufacturing process of the semiconductor device, the external wiring 60 and the signal wiring 100 are necessary to be connected to the main current wiring pattern 120 and the signal wiring pattern 110, respectively, so that the external wiring 60 and the signal wiring 100 do not interfere with each other. In Embodiment 3, the first region 11 is provided in the direction opposite to the signal wiring 100; therefore, interference between the external wiring 60 and the signal wiring 100 is alleviated when the external wiring 60 is bonded to the surface electrode 50.

In the semiconductor device according to Embodiment 3, stable connection of the external wiring 60 to the first region 11 is ensured in the manufacturing process. As a result, productivity and reliability in the manufacturing process are improved. Furthermore, the bonding portion 61 of the external wiring 60 is connected to the surface electrode 50 on the boundary 25; therefore, thermal fatigue at the bonding portion 61 of the external wiring 60 is alleviated. As a result, the long-term reliability of the semiconductor device is improved.

Embodiment 4

A semiconductor device according to Embodiment 4 will be described. Note that the description of the same configurations and operations as in any of Embodiments 1 to 3 is omitted.

Figure 5:
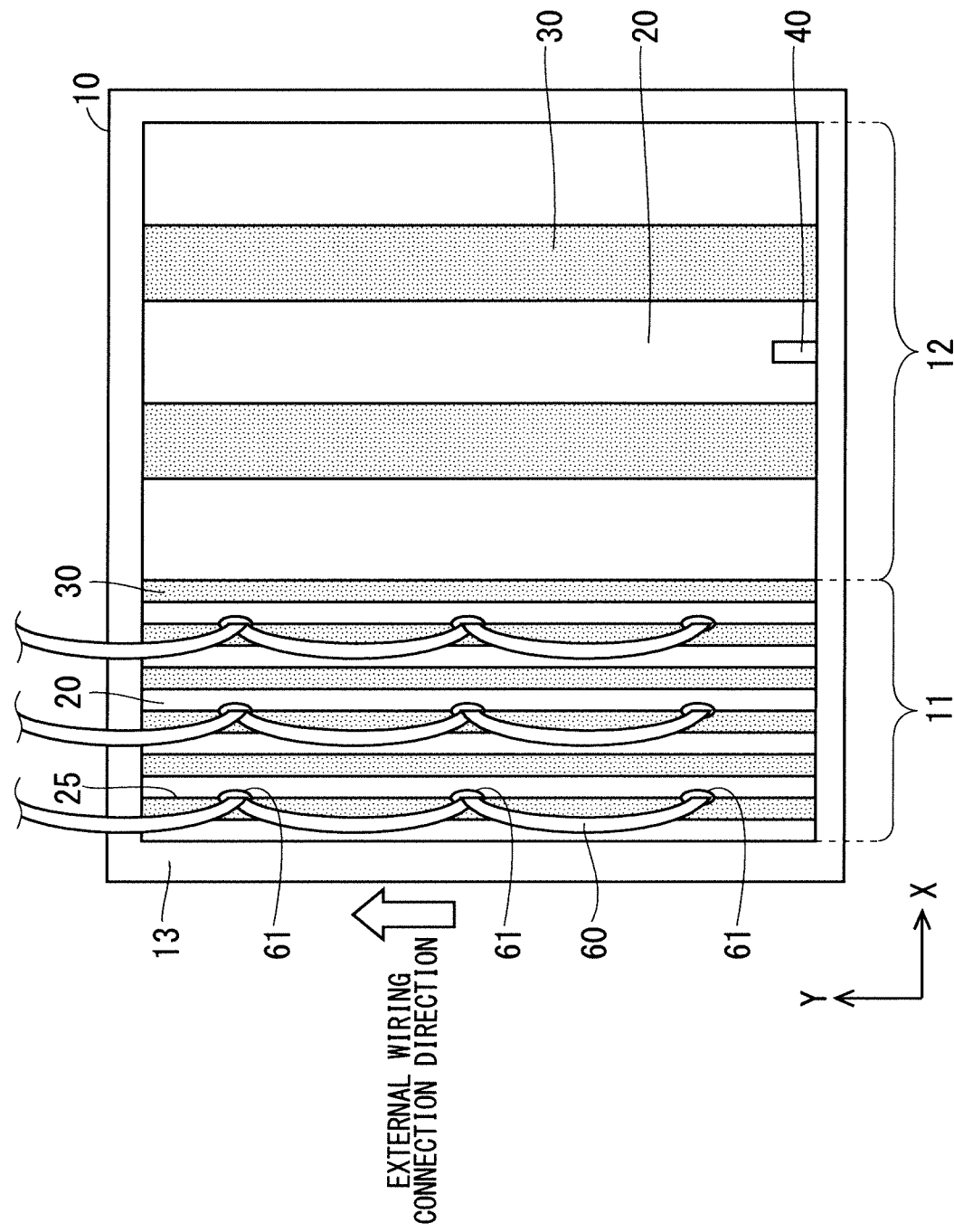
FIG. 5 is a plan view illustrating a configuration of a semiconductor device according to Embodiment 4.

FIG. 5 is a plan view illustrating a configuration of a semiconductor device according to Embodiment 4.

As described above, the transistor portions 20 and the diode portions 30 have a rectangle shape that is long in a direction orthogonal to the arrangement direction in plan view. Therefore, the boundary 25 between the transistor portion 20 and the diode portion 30 in the first region 11 has a boundary line that is long in a direction orthogonal to the arrangement direction. External wiring 60 is connected in parallel with the boundary line between the transistor portion 20 and the diode portion 30 in the first region 11.

The external wiring 60 includes a plurality of bonding portions 61, and the plurality of bonding portions 61 are bonded to the surface electrode 50 at a plurality of positions in the boundary 25. In other words, the external wiring 60 is stitch-bonded on the boundary line, and such wiring is called stitch wiring.

Further, the external wiring 60 extends from the bonding portions 61 in parallel with the boundary line. In other words, the transistor portions 20 and the diode portions 30 are arranged in parallel with the connection direction of the external wiring 60.

In the semiconductor device according to Embodiment 4, it is only necessary to accurately fix the position in the X direction illustrated in FIG. 5 when positioning the external wiring 60 and the bonding locations in the bonding process of the external wiring 60. Thereby, variance in the positions of the bonding portions 61 in the Y direction is reduced.

As described above, in the semiconductor device according to Embodiment 4, stable bonding of the external wiring 60 to the surface electrode 50 on the boundary 25 between the transistor portion 20 and the diode portion 30 is ensured in the manufacturing process.

Furthermore, the external wiring 60 is stitch-bonded; therefore, the heat generated at the bonding portions 61 of the external wiring 60 is dispersed. Thermal fatigue at the bonding portions 61 of the external wiring 60 is alleviated, and as a result, the long-term reliability of the semiconductor device is improved.

Embodiment 5

A semiconductor device according to Embodiment 5 will be described. Note that the description of the same configurations and operations as in any of Embodiments 1 to 4 is omitted.

Figure 6:
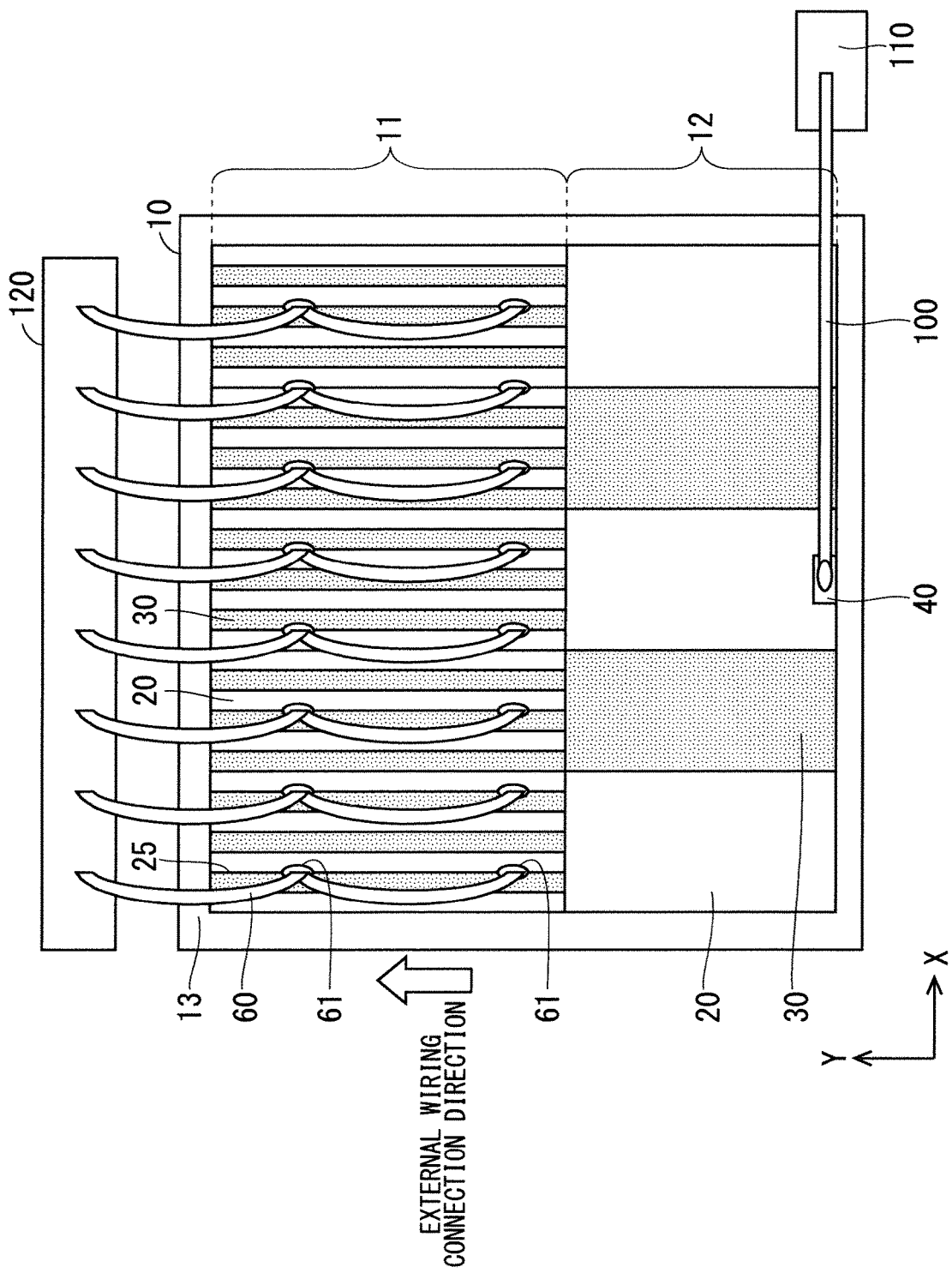
FIG. 6 is a plan view illustrating a configuration of a semiconductor device according to Embodiment 5.

FIG. 6 is a plan view illustrating a configuration of a semiconductor device according to Embodiment 5.

In Embodiment 5, the first region 11 and the second region 12 are arranged adjacent to a direction (Y direction) orthogonal to the arrangement direction (X direction in FIG. 5) of the transistor portions 20 and the diode portions 30. The first region 11 is provided in the direction opposite to the signal wiring 100 connected to the gate electrode 40.

The signal wiring 100 electrically connects a signal wiring pattern 110 provided outside the semiconductor substrate 10 and the gate electrode 40 provided on the surface of the semiconductor substrate 10. Here, the signal wiring 100 extends in the arrangement direction of the transistor portions 20 and the diode portions 30.

The bonding portions 61 of the external wiring 60 are bonded to the surface electrode 50 on the boundary 25 of the transistor portions 20 and the diode portions 30. The external wiring 60 electrically connects the surface electrode 50 and the main current wiring pattern 120 provided outside the semiconductor substrate 10. The external wiring 60 extends from the bonding portion 61 in a direction different from the direction in which the signal wiring 100 is located.

As described above, the transistor portions 20 and the diode portions 30 have a rectangle shape that is long in a direction orthogonal to the arrangement direction in plan view. Therefore, the boundary 25 between the transistor portion 20 and the diode portion 30 in the first region 11 has a boundary line that is long in a direction orthogonal to the arrangement direction. The external wiring 60 is connected in parallel with the boundary line between the transistor portion 20 and the diode portion 30 in the first region 11.

The external wiring 60 includes a plurality of bonding portions 61, and the plurality of bonding portions 61 are bonded to the surface electrode 50 at a plurality of positions in the boundary 25. In other words, the external wiring 60 is stitch-bonded on the boundary line, and such wiring is called stitch wiring.

Further, the external wiring 60 extends from the bonding portions 61 in parallel with the boundary line. In other words, the transistor portions 20 and the diode portions 30 are arranged in parallel with the connection direction of the external wiring 60.

In the manufacturing process of the semiconductor device, the external wiring 60 and the signal wiring 100 are necessary to be connected to the main current wiring pattern 120 and the signal wiring pattern 110, respectively, so that the external wiring 60 and the signal wiring 100 do not interfere with each other. In Embodiment 5, the first region 11 is provided in the direction opposite to the signal wiring 100; therefore, interference between the external wiring 60 and the signal wiring 100 is alleviated when the external wiring 60 is bonded to the surface electrode 50.

In the semiconductor device according to Embodiment 5, stable connection of the external wiring 60 to the first region 11 is ensured in the manufacturing process. As a result, productivity and reliability in the manufacturing process are improved. Furthermore, the external wiring 60 is stitch-bonded; therefore, the heat generated at the bonding portions 61 of the external wiring 60 is dispersed. Thermal fatigue at the bonding portions 61 of the external wiring 60 is alleviated, and as a result, the long-term reliability of the semiconductor device is improved.

Embodiment 6

A semiconductor device according to Embodiment 6 will be described. Note that the description of the same configurations and operations as in any of Embodiments 1 to 5 is omitted.

Figure 7:
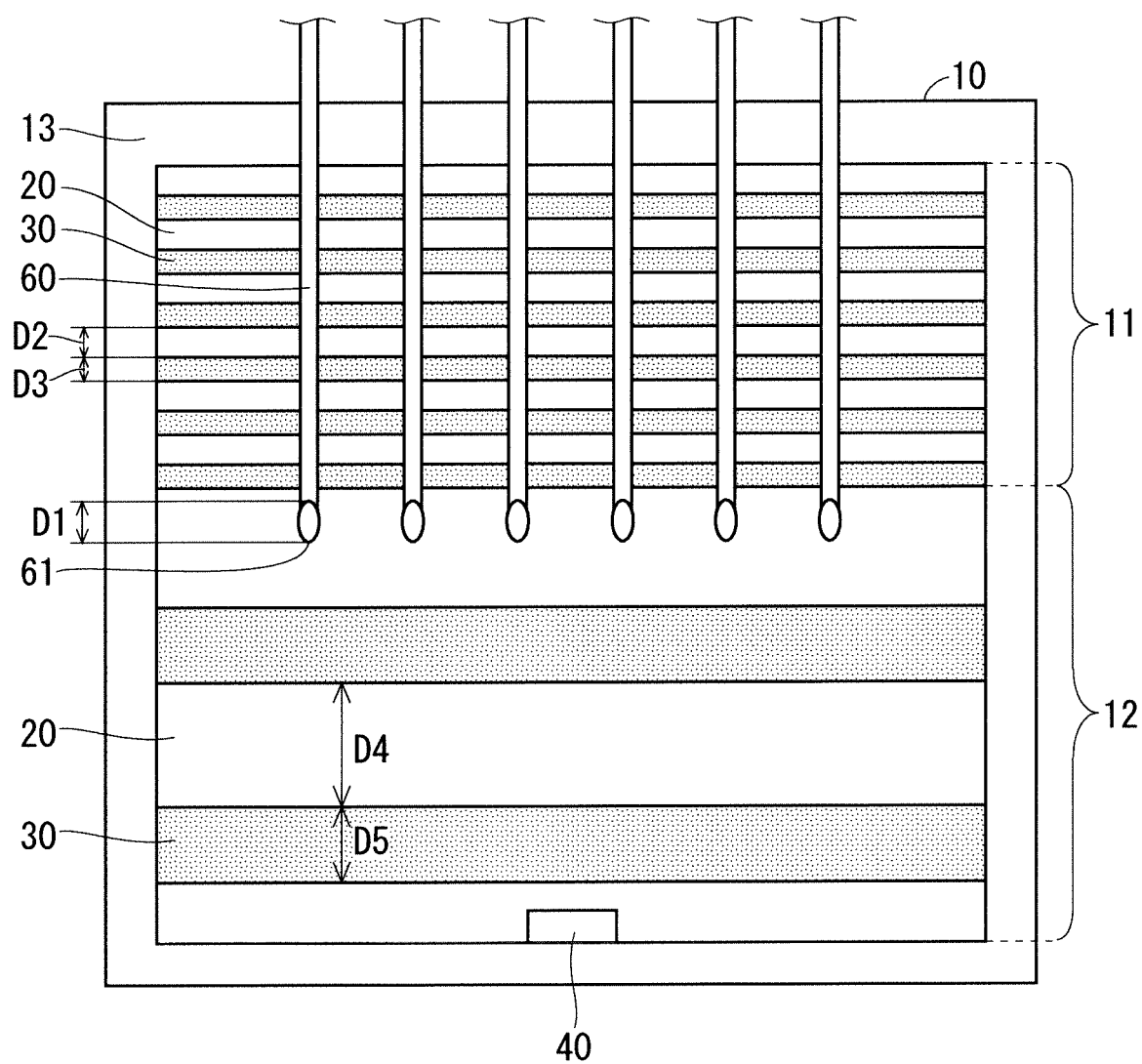
FIG. 7 is a plan view illustrating a configuration of a semiconductor device according to Embodiment 6.

FIG. 7 is a plan view illustrating a configuration of a semiconductor device according to Embodiment 6.

The first transistor width (D2) is larger than the first diode width (D3), and the second transistor width (D4) is larger than the second diode width (D5).

In such a semiconductor device, the current density of the transistor portions 20 is small. Therefore, the semiconductor device prevents the temperature rise of the semiconductor device.

Embodiment 7

A semiconductor device according to Embodiment 7 will be described. Note that the description of the same configurations and operations as in any of Embodiments 1 to 6 is omitted.

The semiconductor device in Embodiment 7 has the same configuration as the semiconductor device described in any of Embodiments 1 to 6. However, the half value of the smaller one of the first transistor width (D2) and the first diode width (D3) is larger than the value of the doubled thickness (D6) of the semiconductor substrate 10. In other words, the semiconductor device in Embodiment 7 satisfies the relational expression of $D2 \times 0.5 > D6 \times 2$ or $D3 \times 0.5 > D6 \times 2$.

Such a semiconductor device sufficiently reduces the snapback operation and prevents deterioration of the on-voltage.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor substrate;

a plurality of transistor portions and a plurality of diode portions are provided in the semiconductor substrate and are arranged in one direction parallel with a surface of the semiconductor substrate;

a surface electrode provided on the surface of the semiconductor substrate and electrically connected to the plurality of transistor portions and the plurality of diode portions; and external wiring including a bonding portion bonded to the surface electrode and electrically connected to the surface electrode at the bonding portion, wherein the plurality of transistor portions and the plurality of diode portions are provided in a first region and a second region of the semiconductor substrate in plan view, each of the plurality of transistor portions and each of the plurality of diode portions have a rectangular shape that is long in a second direction that is orthogonal to the one direction and are alternately arranged in the one direction in both the first region and the second region, a first transistor width which is a width in the one direction of each of the plurality of transistor portions in the first region and a first diode width which is a width in the one direction of each of the plurality of diode portions in the first region are smaller than a width of the bonding portion of the external wiring, a second transistor width which is a width in the one direction of each of the plurality of transistor portions in the second region and a second diode width which is a width in the one direction of each of the plurality of diode portions in the second region are larger than the width of the bonding portion of the external wiring, each of the plurality of transistor portions includes a drift region, and at a start of energization of the transistor portions:

a parasitic resistance between each drift region of the transistor portions in the first region and a respective adjacent one of the diode portions is smaller than a parasitic resistance between each drift region of the transistor portions in the second region and a respective adjacent one of the diode portions, a snapback operation is more likely to occur in the first region than in the second region, and bipolar operation is more likely to occur in the second region than in the first region.

2. The semiconductor device according to claim 1, wherein the bonding portion of the external wiring is bonded to the surface electrode on a boundary between one of the plurality of transistor portions in the first region and one of the plurality of diode portions in the first region, the one diode portion being adjacent to the one transistor portion.

3. The semiconductor device according to claim 2, wherein each of the plurality of transistor portions and each of the plurality of diode portions are arranged in parallel with a connection direction of the external wiring, the external wiring is connected in parallel with a boundary line between the one transistor portion and the one diode portion in the first region, and the bonding portion is connected to the boundary.

4. The semiconductor device according to claim 3, further comprising a gate electrode provided on the surface of the semiconductor substrate in the second region, wherein the first region is provided in a direction opposite to signal wiring connected to the gate electrode.

5. The semiconductor device according to claim 2, wherein the external wiring includes a plurality of bonding portions bonded to the surface electrode at a plurality of positions in the surface electrode on the boundary, and each of the plurality of bonding portions corresponds to the bonding portion.

6. The semiconductor device according to claim 5, further comprising a gate electrode provided on the surface of the semiconductor substrate in the second region, wherein the external wiring extends from the plurality of bonding portions in a direction different from a direction in which signal wiring connected to the gate electrode is located.

7. The semiconductor device according to claim 1, further comprising a gate electrode provided on the surface of the semiconductor substrate in the second region, wherein the first region is provided in a direction opposite to signal wiring connected to the gate electrode.

8. The semiconductor device according to claim 1, wherein the first transistor width is larger than the first diode width and the second transistor width is larger than the second diode width.

9. The semiconductor device according to claim 1, wherein a half value of smaller one of the first transistor width and the first diode width is larger than a value of a doubled thickness of the semiconductor substrate.

10. The semiconductor device according to claim 1, further comprising a gate electrode provided on the surface of the semiconductor substrate in the second region, wherein the external wiring extends from the bonding portion in a direction different from a direction in which signal wiring connected to the gate electrode is located.

11. The semiconductor device according to claim 1, wherein the plurality of transistor portions and the plurality of diode portions each have a stripe structure.

12. The semiconductor device according to claim 11, wherein the first transistor width is a width of the stripe structure of each of the plurality of transistor portions in the first region, the first diode width is a width of the stripe structure of each of the plurality of diode portions in the first region, the second transistor width is a width of the stripe structure of each of the plurality of transistor portions in the second region, and the second diode width is a width of the stripe structure of each of the plurality of diodes portions in the second region.

13. The semiconductor device according to claim 11, wherein the first transistor width, the second transistor width, the first diode width, and the second diode width are each measured along the one direction.

14. The semiconductor device according to claim 1, wherein the plurality of transistor portions and the plurality of diode portions overlap only in a view along the one direction.

15. The semiconductor device according to claim 1, wherein
 the plurality of transistor portions and the plurality of diode portions are alternately arranged only in the one direction.

* * * * *